(12) United States Patent
Mahajani et al.

(10) Patent No.: US 8,168,269 B2
(45) Date of Patent: May 1, 2012

(54) PLASMA, UV AND ION/NEUTRAL ASSISTED ALD OR CVD IN A BATCH TOOL

(75) Inventors: Mahreeyee Mahajani, Saratoga, CA (US); Joseph Yudovsky, Campbell, CA (US); Brendon McDougall, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/883,889

(22) Filed: Sep. 16, 2010

(65) Prior Publication Data
US 2011/0000433 A1    Jan. 6, 2011

Related U.S. Application Data

(62) Division of application No. 11/381,970, filed on May 5, 2006, now Pat. No. 7,798,096.

(51) Int. Cl.
*H05H 1/24* (2006.01)
*C23C 16/00* (2006.01)

(52) U.S. Cl. .................... 427/569; 427/248.1

(58) Field of Classification Search .............. 427/569, 427/248.1
See application file for complete search history.

(56) References Cited

U.S. PATENT DOCUMENTS

| | | | | |
|---|---|---|---|---|
| 5,217,560 | A | * | 6/1993 | Kurono et al. .......... 156/345.43 |
| 5,453,305 | A | * | 9/1995 | Lee ............................. 427/562 |
| 7,300,885 | B2 | * | 11/2007 | Hasebe et al. ............. 438/758 |
| 2003/0089308 | A1 | * | 5/2003 | Raaijmakers ............... 117/200 |
| 2003/0164143 | A1 | * | 9/2003 | Toyoda et al. ........... 118/723 E |
| 2006/0199357 | A1 | * | 9/2006 | Wan et al. .................. 438/482 |

OTHER PUBLICATIONS

Notice to File a Response issued Oct. 19, 2010 in Korean Application No. 10-2008-7029816.

* cited by examiner

*Primary Examiner* — Kelly M Gambetta
(74) *Attorney, Agent, or Firm* — Patterson & Sheridan, LLP

(57) ABSTRACT

A batch processing chamber includes a chamber housing, a substrate boat for containing a batch of substrates in a process region, and an excitation assembly for exciting species of a processing gas. The excitation assembly is positioned within the chamber housing and may include plasma, UV, or ion assistance.

1 Claim, 9 Drawing Sheets

PLASMA, UV AND ION/NEUTRAL ASSISTED ALD OR CVD IN A BATCH TOOL

CROSS-REFERENCE TO RELATED APPLICATIONS

This application is a divisional of U.S. patent application Ser. No. 11/381,970, filed May 5, 2006, now U.S. Pat. No. 7,798,096 which is herein incorporated by reference.

BACKGROUND OF THE INVENTION

1. Field of the Invention

Embodiments of the invention generally relate to an apparatus and a method used during a batch deposition process, and more specifically, embodiments relate to a batch processing chamber and a batch processing method for depositing a material using a processing gas having excited species.

2. Description of the Related Art

A substrate fabrication process is often evaluated by two related and important factors, which are device yield and the cost of ownership (COO). The COO, while affected by a number of factors, is greatly affected by the number of substrates processed per time, i.e., the throughput of the fabrication process, and cost of processing materials. Batch processing has been found to be promising in the attempt to increase throughput. However, providing processing conditions uniformly over an increased number of substrates is a challenging task.

In addition, plasma assisted ALD or CVD processes, UV assisted (photo-assisted) ALD or CVD processes, and ALD or CVD processes having assistance directly by ions provided to a processing area have been shown to be beneficial to some deposition processes. For example, UV and plasma assisted processes have been demonstrated to provide good film quality for high-k dielectrics which are increasingly needed as device scale approaches sub 65 nm applications. Plasma assisted ALD or CVD have also been demonstrated to reduce thermal budget and process time requirements as compared to similar thermally assisted processes.

Providing uniform process conditions over an increased number of substrates is even more challenging if additional assisting treatments are added to the processes as described above for plasma assisted ALD or CVD processes, UV assisted (photo-assisted) ALD or CVD processes, and ALD or CVD processes having assistance directly by ions provided to a processing area.

Plasma assisted ALD processes have used remote plasma generation to attempt exposing substrates to uniform plasma conditions within a batch chamber. The plasma is introduced through a delivery system such as the gas delivery system of the batch tool. However, this process may suffer from the relaxation of the plasma prior to entering the process region.

Therefore, there is a need for an apparatus and a method for uniformly and effectively depositing materials during ALD or CVD processes in a batch tool with plasma assistance, UV assistance, or ion assistance.

SUMMARY OF THE INVENTION

The invention generally provides a batch processing apparatus in which a plurality of substrates is processed in parallel. The apparatus includes an assembly for exciting species of the one or more processing gases used for processing the substrates by a plasma assistance, a UV assistance and/or an ion assistance. Embodiments of the invention generally provide methods of the assisted processes and apparatuses, in which the assisted processes may be conducted for providing uniformly deposited material.

According to one embodiment, a batch processing chamber is provided which includes a chamber housing of the batch chamber, a substrate boat for containing a batch of substrates in a process region, and an excitation assembly for exciting species of a processing gas. The excitation assembly is positioned within the chamber housing.

According to another embodiment, a method for batch processing of substrates is provided which includes processing a batch of substrates vertically stacked in a substrate boat positioned within a chamber, injecting processing gases into a process region within the chamber, and assisting the processing by exciting species of the processing gas within the chamber.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention generally provides an apparatus and a method for processing semiconductor substrates in a batch with assemblies for assisting the processes by generated ions. In one embodiment of the invention, a batch processing chamber with an excitation assembly, which is positioned within the batch processing chamber housing, is provided. An example of a batch processing chamber which may be useful for one embodiment described herein is a FLEXSTAR® system, available from Applied Materials, Inc., located in Santa Clara, Calif.

Generally, excited species of processing gases may be generated to assist the ALD or CVD processes as described herein. These species may be excited by plasma assistance, UV assistance (photo assistance), ion assistance (e.g., ions generated by an ion source), or combinations thereof. The species are excited in or in the vicinity of the process region within the chamber housing to avoid relaxation of the excited states before the ions reach the process region of the batch processing chamber.

A "substrate" as referred to herein, includes, but is not limited to, semiconductor wafers, semiconductor workpieces, and other workpieces such as optical planks, memory disks and the like. Embodiments of the invention may be applied to any generally flat workpiece on which material is deposited by the methods described herein.

"Vertical direction" and "horizontal direction" are to be understood as indicating relative directions. Thus, the horizontal direction is to be understood as substantially perpendicular to the vertical direction and vice versa. Nevertheless, it is within the scope of the invention that the described embodiments and aspects may be rotated in its entirety such that the dimension referred to as the vertical direction is oriented horizontally and, at the same time, the dimension referred to as the horizontal direction is oriented vertically.

A batch processing chamber for ALD or CVD processing useful for embodiments described herein is described in commonly assigned U.S. patent application Ser. No. 11/249,555, entitled "Reaction Chamber with Opposing Pockets for Gas Injection and Exhaust," filed Oct. 13, 2005, which is incorporated herein by reference for providing further description of a chamber, a heating system, a gas delivery system, and an exhaust system.

Figure 1:
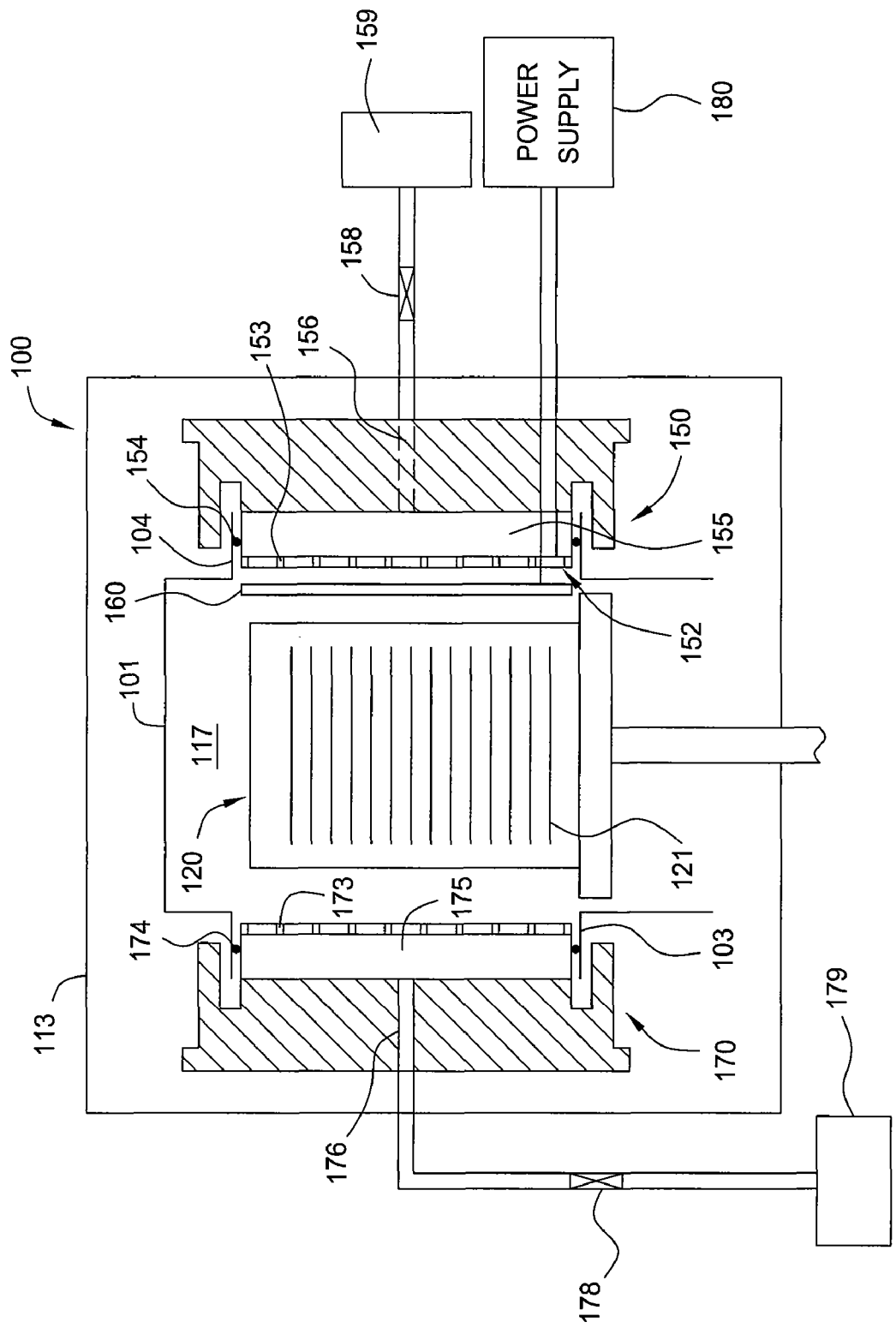
FIG. 1 illustrates a sectional side view of an exemplary batch processing chamber of the invention including an assembly for exciting species of the processing gases.

FIG. 1 illustrates one embodiment of a batch processing chamber having an inner chamber 101 (e.g., a quartz chamber), and controlled inject and exhaust. Typically, the inject assembly 150 and the exhaust assembly 170 are temperature controlled to avoid condensation of processing gases. FIG. 1 is a sectional side view of a batch processing chamber 100. The batch processing chamber 100 generally contains an inner chamber 101 defining a process region 117 configured to accommodate a batch of substrates 121 stacked in a substrate boat 120. The substrates are provided in the process region to be processed by various deposition processes, such as an ALD process or a CVD process. Generally, one or more heater blocks (not shown) are arranged around the inner chamber 101 and are configured to heat the substrates 121 provided in the process region 117. In one embodiment, the inner chamber 101 may for example be a quartz chamber. An outer chamber 113 is generally disposed around the inner chamber 101. One or more thermal insulators (not shown) may be provided between the outer chamber 113 and any heaters in order to keep the outer chamber cool.

Figure 2:
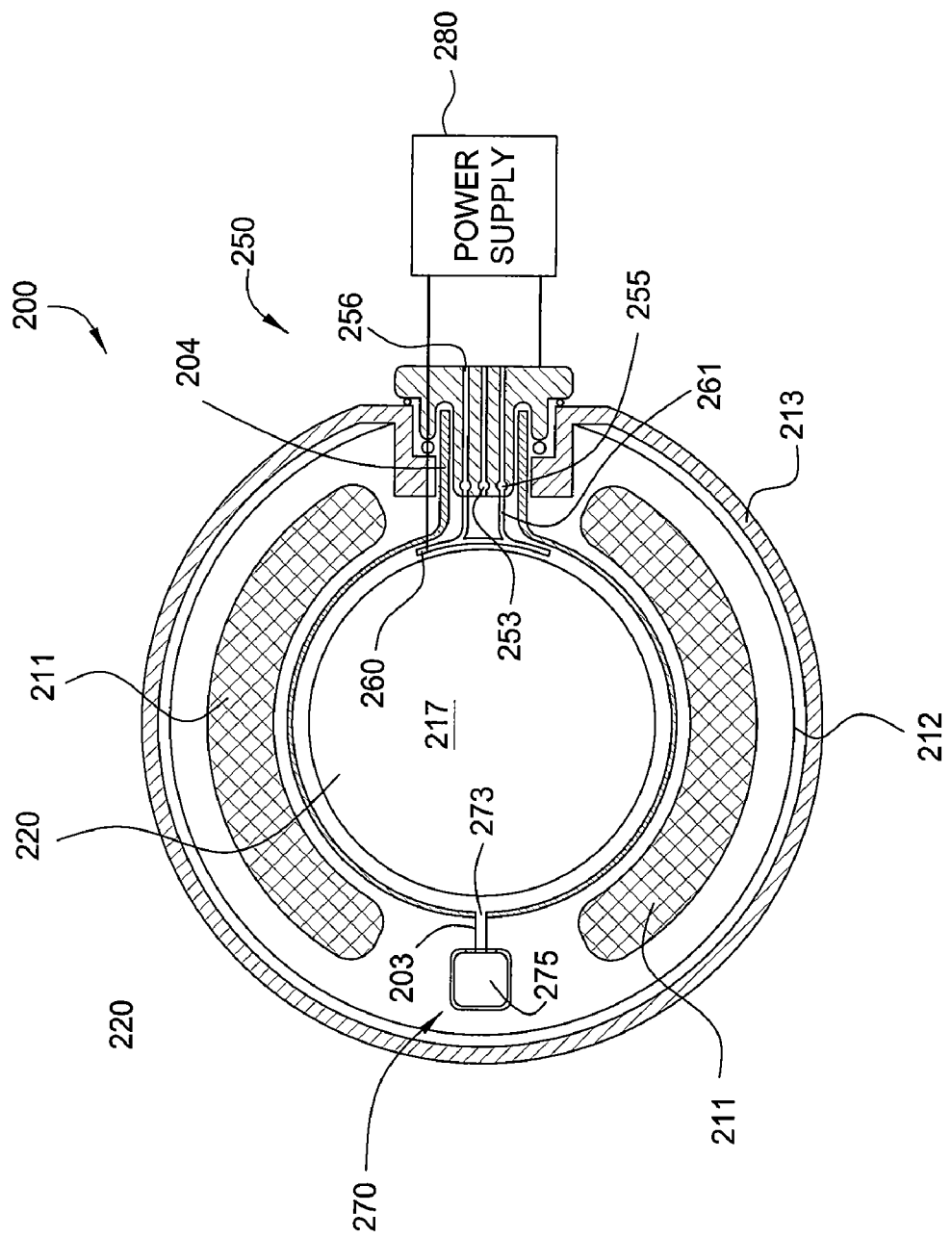
FIG. 2 illustrates a sectional top view of a further embodiment of a batch processing chamber of the invention including an assembly for exciting species of the processing gases.

An example of the heater blocks and the thermal insulators, which may be used in the embodiment shown in FIG. 1, is shown in the embodiment of FIG. 2. FIG. 2, shows one or more heater blocks 211, which are arranged around the inner chamber 201 and are configured to heat the substrates provided in the process region. An outer chamber 213 is generally disposed around the inner chamber 201. In one embodiment, the inner chamber 201 may, for example, be a quartz chamber. In FIG. 2, thermal insulators 212 are be provided between the outer chamber 213 and any heaters in order to keep the outer chamber cool.

FIG. 1 shows the inner chamber 101, e.g., a quartz chamber, generally containing a chamber body having an opening on the bottom, an injector pocket formed on one side of the chamber body, an exhaust pocket formed on the chamber body on an opposite side of the injector pocket. The inner chamber 101 has a cylindrical shape similar to that of the substrate boat 120. Thereby, the process region 117 may be kept small. A reduced process region reduces the amount of processing gas per batch and shortens residence time during batch processing.

In one embodiment, the exhaust pocket 103 and the injector pocket 104 may be welded in place with slots milled on the chamber body of inner chamber 101. According to one embodiment, the injector pocket and the exhaust pocket are flattened quartz tubing with one end welded on the chamber body and one end open. The injector pocket 104 and the exhaust pocket 103 are configured to house injector assembly 150 and exhaust assembly 170. As described in more detail in U.S. patent application Ser. No. 11/249,555, entitled "Reaction Chamber with Opposing Pockets for Gas Injection and Exhaust," filed Oct. 13, 2005, incorporated by reference above, injector assembly 150 and exhaust assembly 170 may typically be temperature controlled. Further, a support plate for supporting the inner (quartz) chamber is further connected to a load lock positioned below the bottom opening of inner chamber 101. The substrate boat 120 may be loaded and unloaded through the load lock. The substrate boat 120 may be vertically translated between the process region 117 and the load lock via the opening at the bottom of the inner chamber.

Examples of substrate boats that may be used in batch processing chambers and during processes described herein are further described in U.S. patent application Ser. No. 11/216,969, entitled "Batch Deposition Tool and Compressed Boat," filed Aug. 31, 2005, which is incorporated herein by reference. Examples of methods and apparatuses for loading and unloading substrate boats used in batch processing is further described in U.S. patent application Ser. No. 11/242,301, entitled "Batch Wafer Handling System," filed Sep. 30, 2005, which is incorporated herein by reference.

The heater blocks are generally wrapped around an outer periphery of the inner chamber 101 except near the injector pocket 104 and the exhaust pocket 103. According to another embodiment (not shown) the heater blocks 211 may also be wrapped around the injector pocket 104 and/or the exhaust pocket 103. The substrates 121 are heated to an appropriate temperature by the heater blocks through the inner chamber 101. The heaters are controlled to achieve uniform heating of the substrates. In one embodiment, points on the substrates 121 in a batch process attain the same set point temperature plus or minus 1 degree Celsius. Configurations of the batch processing chamber 100 improve temperature uniformity in batch processing. For example, a cylindrical shape of the inner chamber 101 results in edges of the substrates 121 evenly distanced from the inner chamber. Also, the heaters may have multiple controllable zones to adjust variations of temperature between regions. The heater blocks may be made of resistive heaters arranged in multiple vertical zones. In one example, the heater blocks may be ceramic resistive heaters.

FIG. 1 illustrates that the injector pocket 104 may be welded on a side of the chamber body defining an inject volume in communication with the process region 117. The inject volume typically extends along the entire height of the substrate boat 120 when the substrate boat is in a process position. The injector assembly 150 disposed in the injector pocket may, thus, provide a horizontal flow of processing gases to every substrate 121.

A recess is formed to hold walls of the injector pocket 104. The injector assembly is thermally isolated, e.g., by seal 154. Seal 154, which may be an o-ring or other suitable elements, also provide a vacuum seal to control the pressure in the inner chamber 101. Thermal isolation of the injector assembly may be desired to independently control the temperature of the injector.

Since the process region 117 and the injector volume are usually kept in a vacuum state during process, an outer volume between inner chamber 101 and chamber 113 may also be evacuated. Keeping the outer volume under a reduced pressure may reduce pressure generated stress on inner chamber 101. Additional vacuum seals, such as o-rings, may be disposed between appropriate parts of chamber 100, in order to control the pressure of the process region 117, the vacuum/pressure stress applied to inner chamber 101, to control gas flow of inserted processing gases only towards the process region. Further, one or more vacuum pumps may be directly or via additional exhaust plenums (not shown) connected to the inner chamber in order to control the pressure in the inner chamber 101.

The temperature of various components in a batch processing chamber may be independently controllable, especially when a deposition process is to be performed in the batch processing chamber. If the temperature of the injector assembly is too low, the gas injected may condense and remain on the surface of the injector assembly, which can generate particles and affect the chamber process. If the temperature of the injector assembly is high enough to evoke gas phase decomposition and/or surface decomposition which may "clog" paths in the injector assembly. An injector assembly of a batch processing chamber is heated to a temperature lower than a decomposition temperature of a gas being injected and higher than a condensation temperature of the gas. The temperature of the injector assembly is generally different than the processing temperature in the process region. In one example, substrates may be heated up to about 600 degrees Celsius, while the temperature of the injector assembly is about 80 degrees Celsius during an atomic layer deposition process. Therefore, the temperature of the injector assembly is controlled independently.

FIG. 1 illustrates that the exhaust pocket 103 may be welded on a side of the chamber body defining an exhaust volume in communication with the process region 117. The exhaust volume typically covers an entire height of the substrate boat 120 when the substrate boat is in a process position such that the exhaust assembly 150 disposed in the exhaust pocket may provide a horizontal flow of processing gases to every substrate 121.

A recess is formed to hold walls of the exhaust pocket 103. The exhaust assembly is thermally isolated, e.g., by seal 174. Seal 174, which may be an o-ring or other suitable elements, also provide a vacuum seal to be able to control the pressure in the inner chamber 101. Thermal isolation of the exhaust assembly may be desired to independently control the temperature of the exhaust.

Since the process region 117 and the exhaust volume are usually kept in a vacuum state during process, an outer volume between inner chamber 101 and chamber 113 may also be evacuated. Keeping the outer volume vacuumed can reduce pressure generated stress on the inner chamber 101. Additional vacuum seals, such as o-rings, may be disposed between appropriate parts of chamber 100, in order to control the pressure of the process region 117, the vacuum/pressure stress applied to inner chamber 101, to control gas flow of inserted processing gases only towards the process region. Further, one or more vacuum pumps may be directly or via additional exhaust plenums (not shown) connected to the inner chamber in order to control the pressure in the inner chamber 101.

Temperature of various components in a batch processing chamber may be controlled independently, especially when a deposition process is to be performed in the batch processing chamber. On the one hand, it is desirable to keep the temperature in the exhaust assembly lower than the temperature in the processing chamber such that the deposition reactions do not occur in the exhaust assembly. On the other hand, it is desirable to heat an exhaust assembly such that processing gases passing the exhaust assembly do not condense and remain on the surface causing particle contamination. If deposition of reaction byproducts on the exhaust assembly does occur, then elevated temperatures on the exhaust assembly may ensure that the deposition has good adhesion. Therefore, the exhaust assembly may be heated independently from the process region.

FIG. 1 illustrates that additionally a gas source 159 is provided. The gas source 159 provides processing gas, like precursor gases or deposition gases, treatment gases, carrier gases, and purge gases via valve 158 and via inlet channel 156 into the vertical channel 155 of the injector assembly. The vertical channel 155 may also be denoted as plenum 155 or cavity 155. The processing gas enters the process region 117 through openings 153 of the injector assembly. The plate and openings form a faceplate 152 to have a uniform distribution of the gas over the substrates 121 in the substrate boat 120.

Generally, carrier gases and purge gases, which may be used as a processing gas, include $N_2$, $H_2$, Ar, He, combinations thereof, and the like. During pretreatment steps $H_2$, $NH_3$, $B_2H_6$, $Si_2H_4$, $SiH_6$, $H_2O$, HF, HCl, $O_2$, $O_3$, $H_2O_2$ or other known gases may be used as a processing gas. In one embodiment, deposition gases or precursor gases may contain a hafnium precursor, a silicon precursor or a combination thereof.

Exemplary hafnium precursors include hafnium compounds containing ligands such as halides, alkylaminos, cyclopentadienyls, alkyls, alkoxides, derivatives thereof or combinations thereof. Hafnium precursors useful for depositing hafnium-containing materials include $HfCl_4$, $(Et_2N)_4Hf$, $(Me_2N)_4Hf$, $(MeEtN)_4Hf$, $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$, or derivatives thereof. Exemplary silicon precursors include $SiH_4$, $Si_2H_6$, TDMAS, Tris-DMAS, TEOA, DCS, $Si_2Cl_6$, BTBAS or derivatives thereof.

Alternative metal precursors used during vapor deposition processes described herein include $ZrCl_4$, $Cp_2Zr$, $(Me_2N)_4Zr$, $(Et_2N)_4Zr$, $TaF_5$, $TaCl_5$, $(^tBuO)_5Ta$, $(Me_2N)_5Ta$, $(Et_2N)_5Ta$, $(Me_2N)_3Ta(N^tBu)$, $(Et_2N)_3Ta(N^tBu)$, $TiCl_4$, $TiI_4$, $(^iPrO)_4Ti$, $(Me_2N)_4Ti$, $(Et_2N)_4Ti$, $AlCl_3$, $Me_3Al$, $Me_2AlH$, $(AMD)_3La$, $((Me_3Si)(^tBu)N)_3La$, $((Me_3Si)_2N)_3La$, $(^tBu_2N)_3La$, $(^iPr_2N)_3La$, derivatives thereof or combinations thereof.

Even though FIG. 1 shows only one gas source, a person skilled in the art will appreciate that a plurality of gas sources, for example, one gas source for a first precursor, one gas source for a second precursor, and one gas source for a carrier and purge gas, may be coupled to the batch processing chamber 100. A gas flow from the different gases may be switched on or off according to the desired needs for a process.

Thereby, 3- or 4-way valves may be used to provide the different gases to the inlet channel 156. Alternatively, two, three, or more inlet channels 156 may milled horizontally across the inject assembly 150 and several vertical channels 155 may be provided to insert different processing gases in the process region.

As an example, inject assembly 250 has more than one inlet channel, e.g., three inlet channels 256, as illustrated in FIG. 2. In one embodiment, each of the three inlet channels 256 is configured to supply the process region 117 with a processing gas independently from each other. Each inlet channel 256 is connected to a vertical channel 255. The vertical channels 255 may also be denoted as cavities 255 or plenums 255. The vertical channels 255 are further connected to a plurality of evenly distributed horizontal holes 253 and form a vertical faceplate on the center portion of the inject assembly 250.

On the opposite end of inner chamber 101 from injector assembly 150 an exhaust pocket 103 is provided in chamber 101. Exhaust pocket receives exhaust assembly 170. An exhaust port 176 is formed horizontally across the exhaust assembly 170 near a center portion. The exhaust port 176 opens to a vertical compartment 175 formed in the center portion. The vertical compartment 175 is further connected to a plurality of horizontal slots 173 which are open to the process region 117. When the process region 117 is being pumped out with vacuum pump 179 via valve 178, processing gases first flow from the process region 117 to the vertical compartment 175 through the plurality of horizontal slots 173. The processing gases then flows into an exhaust system via the exhaust port 176. In one aspect, the horizontal slots 173 may vary in size depending on the distance between a specific horizontal slot 173 and the exhaust port 176 to provide an even draw across the substrate boat 120 from top to bottom.

Processing gases such as precursor gases, deposition gases, treatment gases, purge or carrier gases, as described in more detail above, are delivered to and from process region 117 by injector assembly and exhaust assembly. A uniform gas flow across each substrate 121 as well as a uniform gas flow across all substrates vertically aligned in the substrate boat 120 is desired. However, non-uniformity might be caused by irregularities in the gas flow at the wafer edges. These irregularities may be prevented by providing a diffuser 160 between the injector and the substrate boat. The diffuser 160 may prevent the gas flow from direct impact on the edge of the substrate. Diffuser 160 may have a V-shaped form and may direct gas from the inlet tangentially along the substrates.

The diffuser may be provided in various shapes and positions. Generally, the diffuser may be provided between the faceplate of the injector assembly and the substrate boat. Thereby, the diffuser may be integrated in the substrate assembly and/or may be positioned in the injector pocket of the inner chamber 101. Various embodiments of diffusers which may be used in chambers and methods of the application are described in more detail in U.S. Patent Application, entitled: "Batch Processing Chamber with Diffuser Plate and Injector Assembly", filed on an even dated herewith (U.S. patent application Ser. No. 11/381,966), which is incorporated herein by reference.

The gas flow with improved uniformity carries ionized species of the processing gases, like precursor gases or carrier or purge gases. The uniformity of the gas flow also improves the uniformity of the ionized species, which are used to provide plasma assisted, UV assisted, or ion assisted processes. Generally, the process assistance by plasma, UV, ion generation can be characterized as exciting the introduced gas or by ionizing the introduced gases. The components providing the processing gas flow to the process region 117 are configured to form a uniformly deposited material across each substrate and across the substrates in the substrate boat.

Plasma assisted batch processing has previously been conducted with a remote plasma source. However, a remote plasma is generated at larger distances with regard the process region. Thus, the number of excited species within the plasma has already considerably decreased as the plasma enters the process region. A remote plasma source results in a relaxation of the plasma before the plasma enters the process region.

The invention generally provides an apparatus and a method for processing semiconductor substrates in a batch tool, in which, e.g., the plasma for plasma assisted processing of substrates is provided in the process region or close or adjacent to the process region. Close or adjacent to the process region is to be understood as having the plasma generation directly neighboring the process region, or at least within the inner chamber, the injector pocket, or the injector assembly.

An embodiment illustrated in FIG. 1 includes a power source 180 to generate a plasma, which is connected to the diffuser 160 and the faceplate 152 of the injector assembly 150. A plasma is generated between the diffuser 160 and the faceplate 152 of the injector assembly 150. The injector face is used as an anode and the diffuser is used as a cathode to generate a plasma therebetween. The power applied to generate the plasma can be adapted to the desired application and may depend on the energy necessary to ionize particular species in the processing gas flowing into the process region. As a result, the plasma power may vary depending on the process step presently conducted. For example, for a plasma assisted ALD process, a different power maybe applied during a gas flow of a first precursor, during purging or pumping to remove the first precursor, during gas flow of a second precursor and during purging or pumping to remove the second precursor. Alternatively, some of the process steps may be conducted at similar plasma power or without plasma assistance. For example the purge steps may be conducted with the same power or without power, whereas for the times when precursors are provided to the process region, plasma power adapted for the first and second precursor, respectively, is applied.

As already mentioned above, barrier seal 154 is disposed between the inject pocket 104 and the inject assembly 150, and barrier seal 174 is disposed between the exhaust pocket 103 and the exhaust assembly 170. Thereby, processing chemicals are prevented from entering any undesirable areas in the batch processing chamber. Further, a vacuum seal for the quartz chamber may be provided by seals 154, 174. Additionally, the seals, which may be provided in the form of O-rings or the like, can electrically insulate different components within the chamber from each other. This is of increasing relevance as the power provided by power supply 180 increases. Higher voltages applied to electrodes, e.g., the injector assembly, may require improved electrical insulation of the injector assembly.

Within an embodiment shown in FIG. 1, the plasma may be confined between the face of the injector assembly 150 and the diffuser 160. Thereby, direct exposure of the substrate to a plasma may be avoided. This might be desirable to prevent plasma damage to the surfaces of the substrates. Accordingly, the diffuser shields the substrates from the plasma.

In the embodiments described while making reference to FIG. 1, a plasma is generated in the horizontal direction. The plasma extends along the vertical direction of the diffuser 160 and the injector assembly 150. Thus, the horizontal plasma extends along the vertical direction of the process region 117.

The substrates 121 in the substrate boat 120 are exposed to the plasma along the entire stack of substrates. The previously described uniform gas flow provides a uniform distribution of ionized species of the plasma across the wafers.

FIG. 2 illustrates a further embodiment of a batch processing chamber having an inner chamber 201, and controlled inject and exhaust. Typically, the injector assembly 250 and the exhaust assembly 270 are temperature controlled to avoid condensation of processing gases. FIG. 2 is a sectional top view of a batch processing chamber 200. The batch processing chamber 200 generally contains an inner chamber 201 defining a process region 217 configured to accommodate a batch of substrates stacked in a substrate boat 220. The substrates are provided in the process region to be processed by various deposition processes, such as an ALD process or a CVD process. Generally, one or more heater blocks 211, which are arranged around the inner chamber 201 and are configured to heat the substrates provided in the process region. An outer chamber 213 is generally disposed around the inner chamber 201. In FIG. 2, thermal insulators 212 are provided between the outer chamber 213 and any heaters in order to keep the outer chamber cool.

The inner chamber 201, e.g., a quartz chamber, generally comprises a chamber body having an opening on the bottom, an injector pocket formed on one side of the chamber body, an exhaust pocket formed on the chamber body on an opposite side of the injector pocket. The inner chamber 201 has a cylindrical shape similar to that of the substrate boat 220. Thereby, the process region 117 is kept relatively small. A reduced process region reduces the amount of processing gas per batch and shortens residence time during batch processing.

The exhaust pocket 203 and the injector pocket 204 may be welded in place with slots milled on the chamber body. According to an alternative embodiment, the exhaust pocket may be provided in the form of vertically aligned tubes connecting the processing region with the vertical compartment 275. According to one embodiment, the injector pocket 204 and the exhaust pocket 203 are flattened quartz tubing with one end welded on the chamber body and one end open. The injector pocket 204 and the exhaust pocket 203 are configured to house injector assembly 250 and exhaust assembly 270. Injector assembly 250 and exhaust assembly 270 are typically temperature controlled.

An embodiment illustrated in FIG. 2 includes a power source 280 to generate a plasma, which is connected to the diffuser 260 and the faceplate 252 of the injector assembly 250. A plasma is generated between diffuser 260 and the face of the injector assembly. The injector face is used as an anode and the diffuser is used as a cathode to generate a plasma therebetween. The power applied to generate the plasma can be adapted to the desired application and may depend on the energy necessary to ionize particular species in the processing gas flowing into the process region. As a result, the plasma power may vary depending on the process step presently conducted. For example, for a plasma assisted ALD process, a different power maybe applied during a gas flow of a first precursor, during purging or pumping to remove the first precursor, during gas flow of a second precursor and during purging or pumping to remove the second precursor.

Alternatively, some of the process steps may be conducted at similar plasma power or without plasma assistance. For example, the purge steps may be conducted with the same power or without power, whereas plasma power adapted for the first and second precursor, respectively, is applied during the injection of the respective precursor gases.

In one embodiment, as shown in FIG. 2, the plasma may be confined between the face of the injector assembly 250 and the diffuser 260. Thereby, direct exposure of the substrate to a plasma may be avoided. This might be desirable to prevent plasma damage to the surfaces of the substrates. Accordingly, the diffuser shields the substrates from the plasma.

In the embodiments described while making reference to FIG. 2, a plasma in horizontal direction is generated. The plasma extends along the vertical direction of the diffuser and the injector assembly. Thus, the horizontal plasma extends along the vertical direction of the process region 217. The substrates in the substrate boat 220 are exposed to the plasma along the entire stack of substrates. The previously described uniform gas flow provides a uniform distribution of ionized species of the plasma across the wafers.

The batch processing chamber 200 includes an outer chamber 213, heater blocks 211 separated from the outer chamber by thermals insulators 212. An inner chamber 201 including injector pocket 204 and exhaust pocket 203 or exhaust tubes surrounds substrate boat 220 located in the process region. The injector assembly 250 has three inlet channels 256. Processing gas can be provided through the channels to vertical channels 255 and enters the processing location through openings 253 in the face of injector assembly 250. The exhaust assembly 270 includes exhaust port 176, vertical compartment 275 and horizontal slots 273.

Further, a v-shaped diffuser 260 is shown. Similarly to FIG. 1, a power source is coupled via the injector assembly to the injector face and the diffuser to generate a plasma between the injector face and the diffuser. FIG. 2 further illustrates a conductive mesh 261 that further confines the plasma in the gap between the diffuser and the injector face. The diffuser may additionally be made permeable to confine the plasma and to improve protection of the substrates from energetic particles. A permeable diffuser may improve the uniformity of the gas flow across the wafer. In the case of a permeable diffuser, the diffuser may be provided in the form of a mesh. According to another embodiment (not shown), mesh 261 and a permeable mesh diffuser 260 may be provided as one unit to provide a cathode and to confine the plasma between this cathode and the face of the injector assembly acting as the anode. The confinement of plasma—if desired—may be improved by minimizing or omitting a gap between the injector assembly and the mesh or diffuser. Nevertheless, it is to be understood that insulation may be provided in the event neighboring elements form the anode and the cathode for plasma ignition and maintenance.

The conductive and permeable mesh, the diffuser and the face of the injector assembly extend along the direction in which the substrates are stacked over each other in the substrate boat. In the embodiments shown herein, this direction is the vertical direction. The substrates are vertically stacked. As the plasma is generated adjacent to the process region along the entire height of the process region, on the one hand it is possible to provide uniform plasma assisted process conditions in the process region. On the other hand, since the plasma is generated adjacent the process region hardly any relaxation of the excitation occurs until the excited species get in contact with the substrates in the process region.

Figure 3:
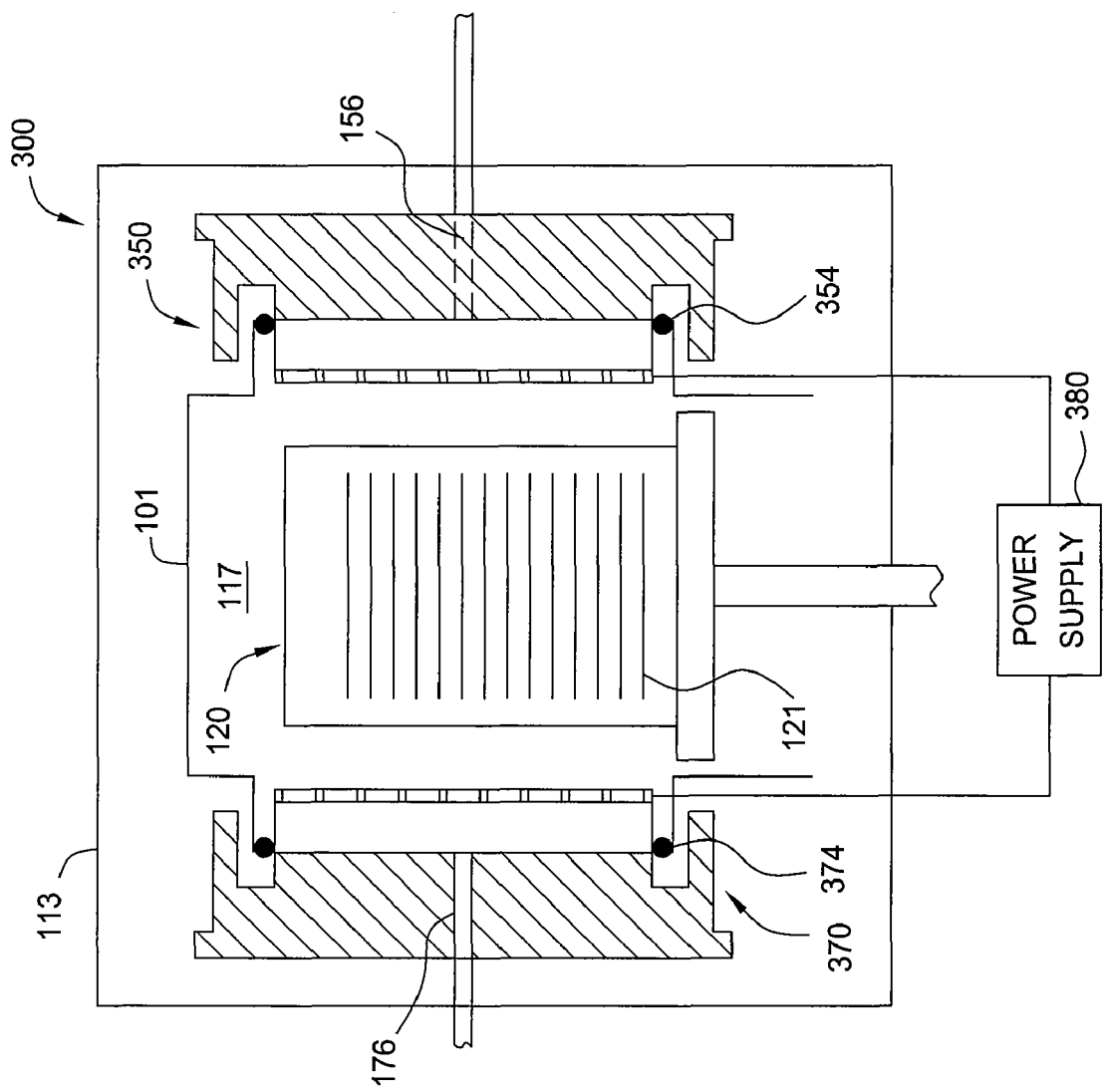
FIG. 3 illustrates a sectional side view of an embodiment of a batch processing chamber of the invention including an assembly for exciting species of the processing gases within a process region.

FIG. 3 illustrates another embodiment of a batch processing chamber 300 wherein plasma assisted ALD processes, plasma assisted CVD processes or other plasma assisted processes may be conducted. Within FIG. 3, elements that are the same in the embodiment of FIG. 1 are denoted with the same reference numbers. Alternatively, these elements may be the same as in the embodiment shown in FIG. 2. A repetition of the description of these elements and the related purposes or usage is omitted for simplicity.

A power supply 380 is connected to the injector assembly 350 and the exhaust assembly 370 in order to generate a plasma between the face of the injector and the opposing port of the exhaust.

The plasma is generated horizontally, that is parallel to the surfaces of the substrates. The plasma extends along the process region 117 of the inner chamber 101. The exhaust port may be used as the cathode and the face of the injector assembly may be used as the anode. In light of the increased distance between the anode and the cathode, the voltage provided by the power supply between the cathode and the anode has to be increased in order to provide the same electrical field acting on the species of the processing gas. As a result of the increased potential difference, the charged components may need further electrical isolation from surrounding components. In FIG. 3, this is indicated by an increased gap between the injector assembly 350 and the injector pocket of the inner chamber 101. Further, the gap of the exhaust assembly 370 is increased. Seals 354 and 374 are also increased in size to indicate the further electrical insulation. Even though, in the case of a quartz chamber, an insulation of the face of the injector assembly and the port of the exhaust assembly may partly be provided by the non-conductive inner chamber, potentials sufficiently high to create a plasma across the process region may need additional insulation of components in the batch processing chamber 300.

Figure 4:
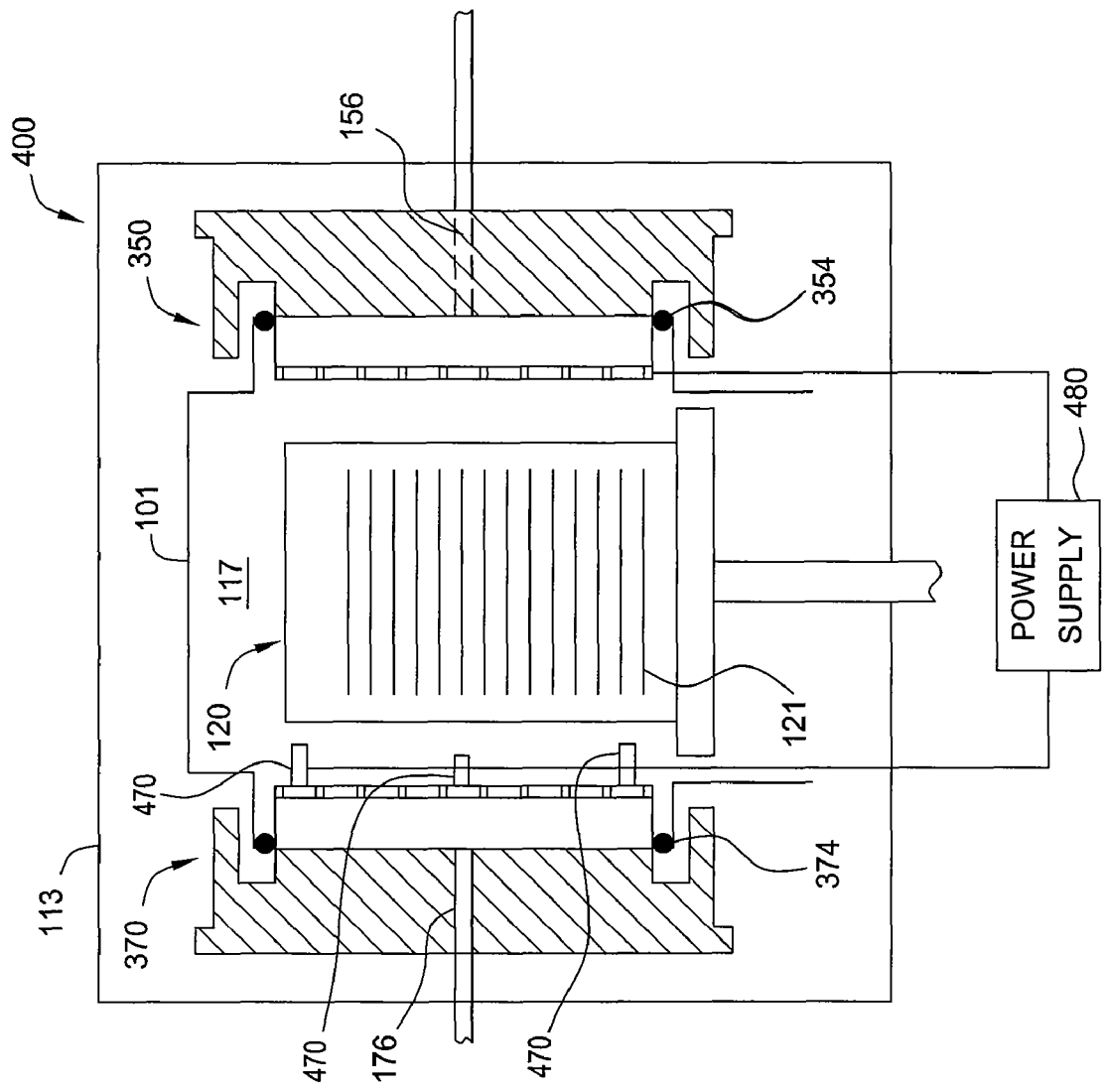
FIG. 4 illustrates a sectional side view of another embodiment of a batch processing chamber of the invention including an assembly for exciting species of the processing gases within a process region.

A further embodiment of a batch processing chamber 400 providing the option of conducting plasma assisted processes is shown in FIG. 4. Within FIG. 4, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

Within FIG. 4, as compared to chamber 300 of FIG. 3, an electrode 470 is positioned in the inner chamber 101. The electrode 470 or the electrodes 470 may be provided in the form of a rod disposed within the chamber cavity adjacent to the exhaust assembly. Power supply 480 is connected to electrodes 470 and to the injector assembly 350. The faceplate of the injector assembly acts as an electrode. Within the embodiment shown in FIG. 4, a plasma is generated horizontally, parallel to the substrate surfaces of the substrates in the substrate boat. The generated plasma extends across the process region and is exposed to the substrates.

FIG. 4 shows three rods 470 as electrodes for plasma generation. Alternatively, one or two vertical rods may also be used as electrodes. Further, 4 or more rods may be used as electrodes. The number and the arrangement of electrodes should be adapted to provide a uniform plasma across the substrates and to not disturb the uniformity of the gas flow of the processing gases.

According to another embodiment (not shown), the rods may also be positioned between the face of the injector assembly and the substrate boat. Thereby, a plasma generation comparable to FIG. 1 may occur. The plasma is generated adjacent the substrate boat within inner chamber 101, e.g., a quartz chamber. The plasma is generated horizontally between the vertically extending face of the injector assembly and the vertically extending set of rods. Thereby, a direct exposure of the substrates to the plasma may be reduced. However, the species of the processing gas, which have been excited by the plasma, have little time to relax before getting in contact with the substrate surface. As a further alternative (not shown), electrodes may also be disposed at other locations in the inner chamber 101.

Figure 5:
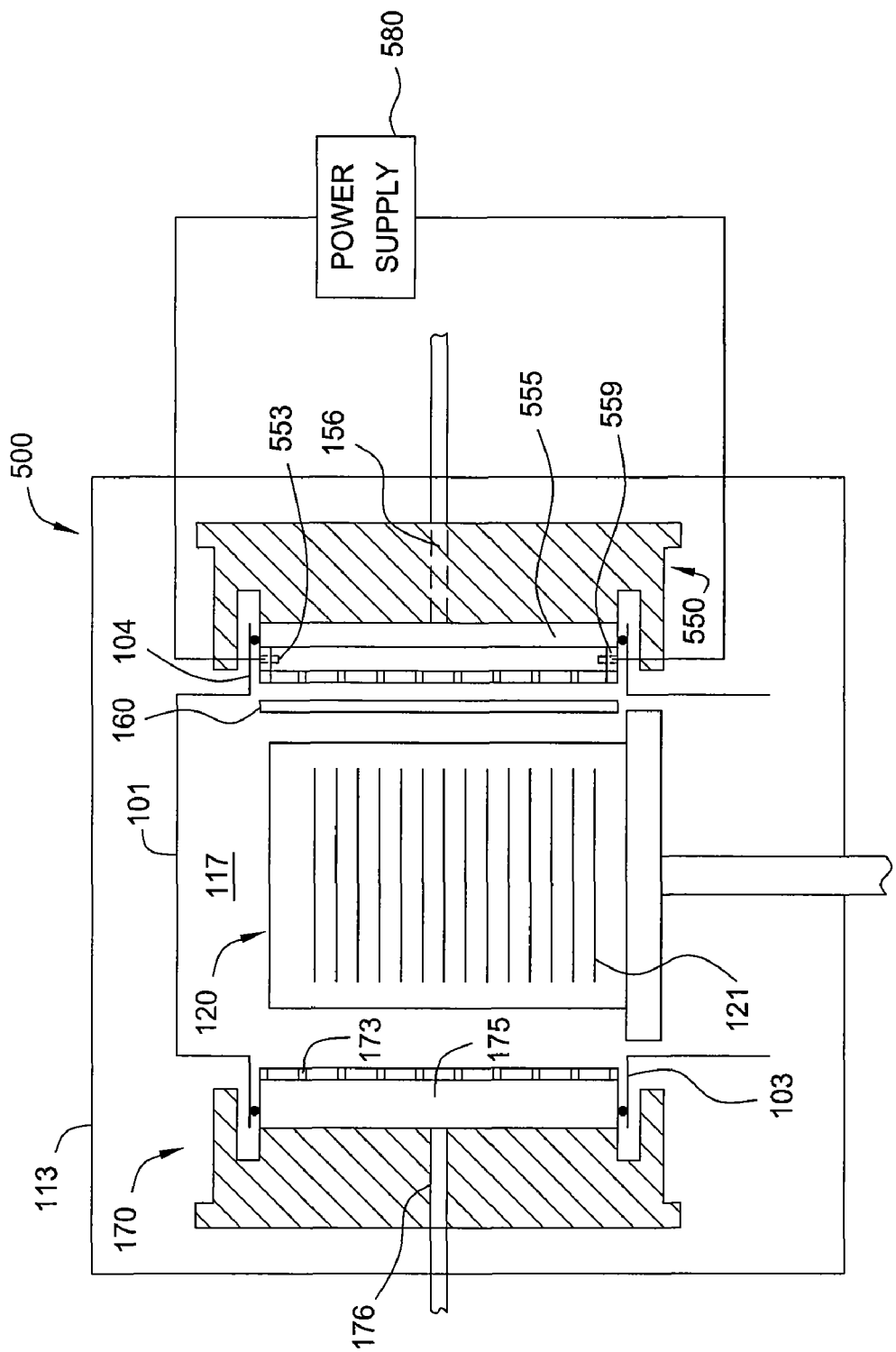
FIG. 5 illustrates a sectional side view of an exemplary batch processing chamber of the invention including an assembly for exciting species of the processing gases within an injector assembly.
Figure 6:
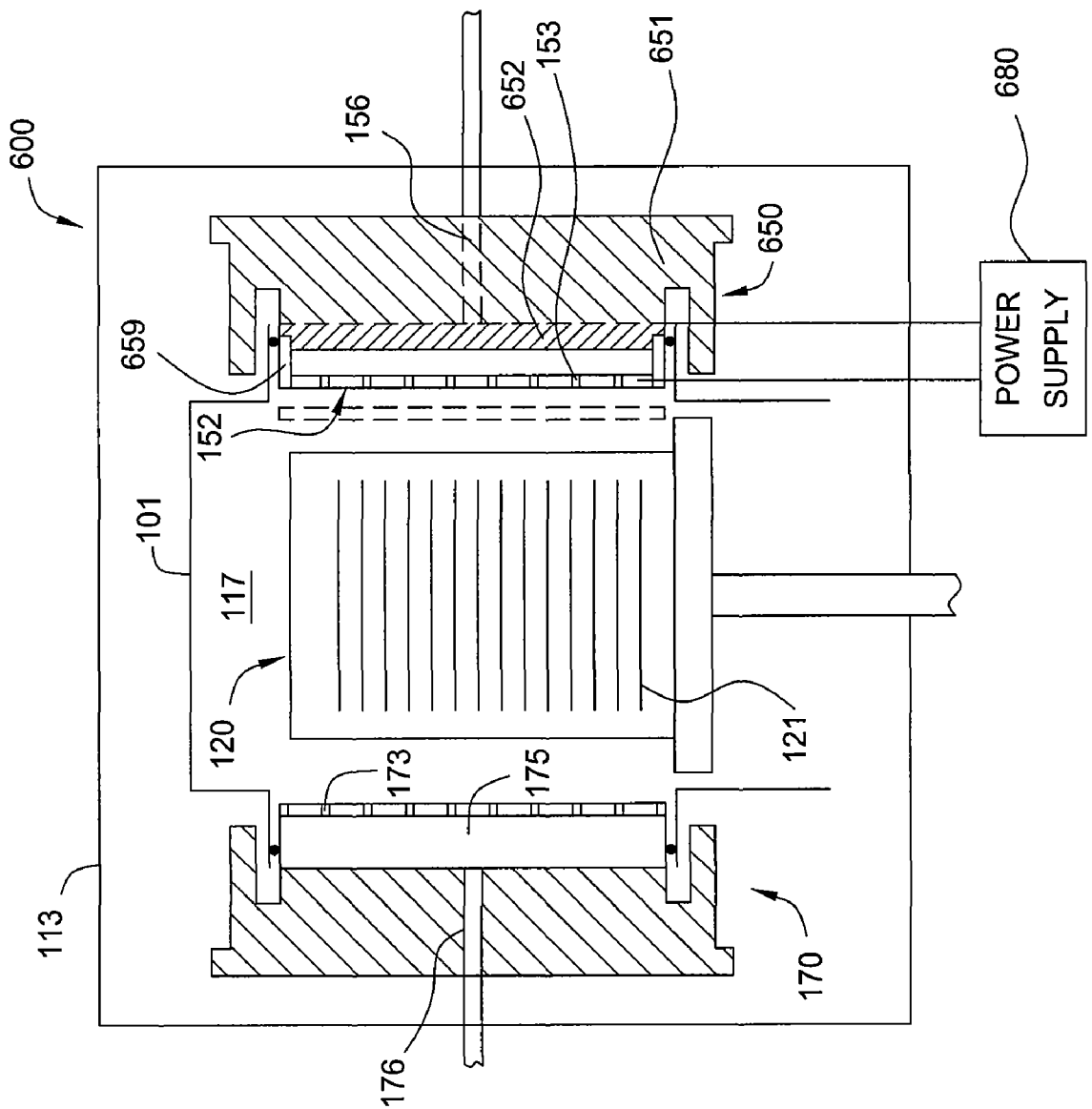
FIG. 6 illustrates a sectional side view of another embodiment of an exemplary batch processing chamber of the invention including an assembly for exciting species of the processing gases within an injector assembly.

FIGS. 5 and 6 illustrate further embodiments. Elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

For the embodiments of FIGS. 5 and 6, the plasma may be generated in the injector assembly. In one embodiment, the plasma may be generated in the vertical channel inside the injector assembly. Also, the vertical channel may be denoted as plenum or cavity.

FIG. 5 shows a batch processing chamber. The injector assembly 550 includes vertical rods 553 insulated from each other by insulator parts 559. Alternatively, the injector 550 may be formed of an insulating material. A plasma power source 580 is connected to the top rod 553 and the bottom rod 553. According to one embodiment the top rod may be the cathode and the bottom rod may be the cathode, whereas to another embodiment the top rod may be the cathode whereas the bottom rod is the anode. The rods form electrodes for generation of a plasma. The generated plasma is confined in the vertically extending channels 555. The plasma is generated vertically and the excited species of the processing gas enter the process region horizontally through the openings in the faceplate of the injector assembly.

According to an alternative embodiment, the faceplate of the injector may be made of a conductive material to improve confinement of the plasma within the vertical channel. The embodiments described with respect to FIG. 5, may optionally include a diffuser 160 as shown in FIG. 5 and described in more detail with respect to FIGS. 1 and 2.

The embodiment shown in FIG. 6 also includes plasma generating elements that provide a plasma in the vertical channel of the injector assembly 650. The plasma is generated between the walls of the vertical channel. One wall is the faceplate 152 including the openings 153. The other wall is electrode 652 is provided in the body 651 of injector assembly 650. Electrode 652 forms the wall of the vertical channel opposing the faceplate 152. The two electrodes connected to the power supply 680 are separated by insulator element 659.

According to an alternative embodiment (not shown), the body 651 of the injector assembly may form one of the electrodes to generate the plasma. The injector is formed of a conductive material and no separate electrode 652 may be required. According to this embodiment, the faceplate forming the opposing electrode would also be connected to the body 651 by insulating elements 659. The embodiments described with respect to FIG. 6, may optionally include a diffuser 160 as shown in FIG. 5 and described in more detail with respect to FIGS. 1 and 2.

Embodiments described herein with respect to FIGS. 1 to 6 illustrate batch processing chambers which may be used during plasma assisted processes, e.g., ALD or CVD processes. Therein, the plasma assistance provides ionized species of the processing gases within the chamber and in or in the vicinity of the process region. The presence of the plasma in the process region or in the vicinity of the process region reduces relaxation of the excited states. Since the plasma assistance provides ionized species of the processing gases to the substrate surfaces, a plasma assisted process can be considered one form of process based on excited species of the processing gases.

In the following, another form of processes with assistance of exciting species and respective embodiments of chambers will be described. The processes, such as ALD processes or CVD processes, are assisted by UV radiation. The UV light may be used to excite and/or ionize species of the processing gases or, e.g., to maintain the $O_3$ concentration at a desired level. In light of the excitation of species of processing gases, i.e., the electrons are excited to higher excitation levels, UV assistance during batch processing may also be considered one form of process that is assisted by excited species.

On irradiation of the processing gases with UV light, species of the processing gases are excited above ground state. The excitation depends on the wavelength of the UV light. The wavelength may be in the range of 126 nm to 400 nm. The excited species assist ALD or CVD processes by initiating or enhancing surface reactions of the precursors or reactance. The enhancement may result in reduction of exposure time and, thus, increase throughput. Additionally, film quality may improve because of more complete reactions of the precursors.

For UV assisted film growth processes, the relaxation time of the excited species may be in a range that by the time the processing gas reaches the process region a remotely excited processing gas has relaxed. For example, the $O_3$ concentration might decrease by the time it reaches the process region of the deposition chamber if excited at a remote location. The $O_3$ concentration may be maintained higher by activating $O_3$ inside the chamber.

Figure 7:
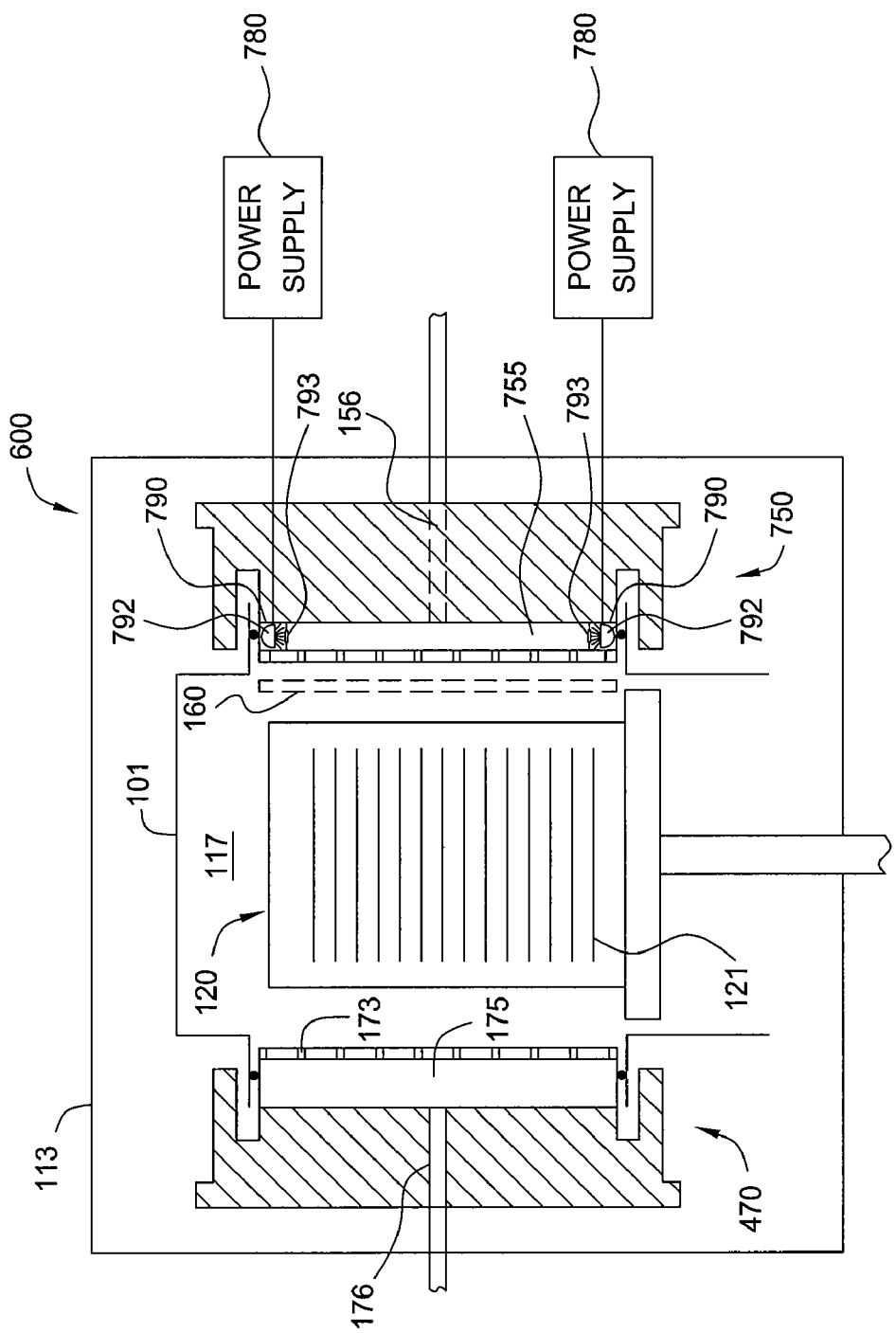
FIG. 7 illustrates a sectional side view of an even further embodiment of an exemplary batch processing chamber of the invention including an assembly for exciting species of the processing gases within an injector assembly.

An embodiment of a batch processing chamber 700 with UV assistance is shown in FIG. 7. Within FIG. 7, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

FIG. 7 illustrates an embodiment for irradiating UV light vertically inside the vertical channel 755 of the injector assembly 750. A UV source 790 is provided at the upper end of the vertical channel 755 and a UV source is provided at the lower end of the vertical channel. Each source includes a lamp 792 and a window 793 facing the vertical channel. The window material can be chosen depending from the UV wavelength. For example a quartz window may be used for wavelength up to about 180 nm to 220 nm. Sapphire, magnesium fluoride or calcium fluoride windows may be used as window 793 in the event of shorter wavelengths.

The UV light extends vertically along the vertical channel 755 and excites species of the processing gases in the injector assembly before entering the process region. Within the embodiment shown in FIG. 7, UV lamps like deuterium lamps or arc lamps filled with Hg or Xe, may be used. The species of the processing gas excited in the vertical channel are provided uniformly with the uniform gas flow generated by the injector assembly, the exhaust assembly and optionally be the diffuser, the gas flow being described in more detail with respect to FIG. 1.

Figure 8:
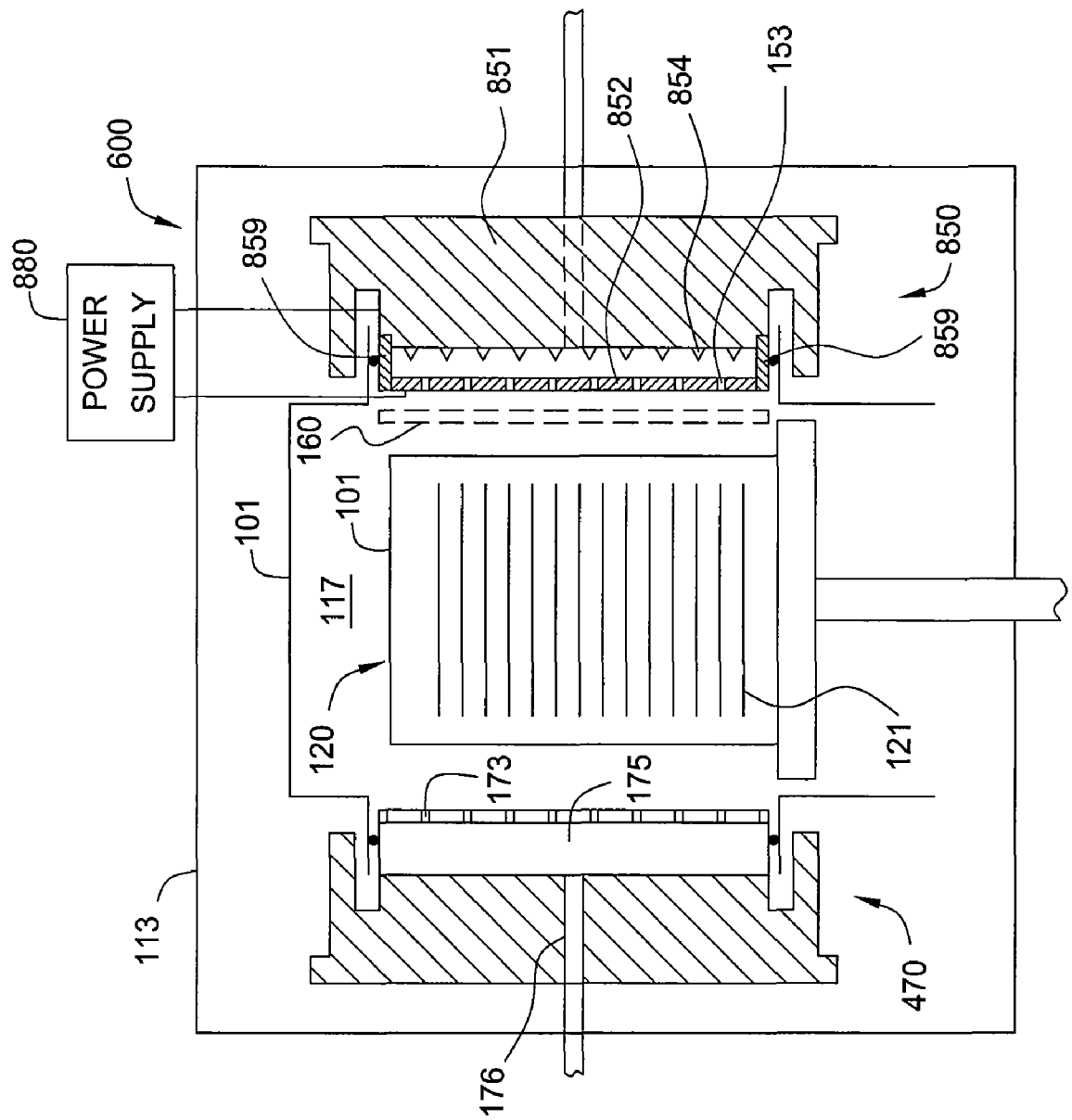
FIG. 8 illustrates a sectional side view of another embodiment of an exemplary batch processing chamber of the invention including an assembly for exciting species of the processing gases within an injector assembly.

FIG. 8 shows another embodiment of batch processing chamber 800 with an injector assembly 850. The embodiment may be used for UV assisted processes. Within FIG. 8, elements that are the same in the embodiments of FIG. 1 or other previous embodiments are denoted with the same reference numbers. Alternatively, these elements may be the same as in the embodiment shown in FIG. 2. A repetition of the description of these elements and the related purposes or usage is omitted for simplicity.

FIG. 8 illustrates that the injector assembly shines UV light through openings 153 of the faceplate horizontally and parallel to substrate surfaces of substrates stacked in a substrate boat. The UV light is generated in the vertical channel 855 by striking a glow discharge with a noble gas in vertical channel 855. The injector face 852 of the faceplate is configured as an anode. The body 851 of the injector is electrically insulated by insulators 859 from the anode. The vertical channel 855 functions as a hollow cathode.

As described with previously with respect to FIG. 2, the injector assembly may have a plurality of vertical channels. A single one of the vertical channels or a plurality of vertical channels may be used as a hollow cathode to provide UV light inside the chamber.

In the event the electrical field in the injector may be too small to strike a glow discharge, tips 854 can be mounted in the injector. Thereby, the electrical field strength near the tips is increased and the glow discharge can be ignited with smaller voltages applied. According to another embodiment (not shown) the tips 854 may be omitted if sufficient power is provided by power source 880 to strike the glow discharge in the vertical channel.

Figure 9:
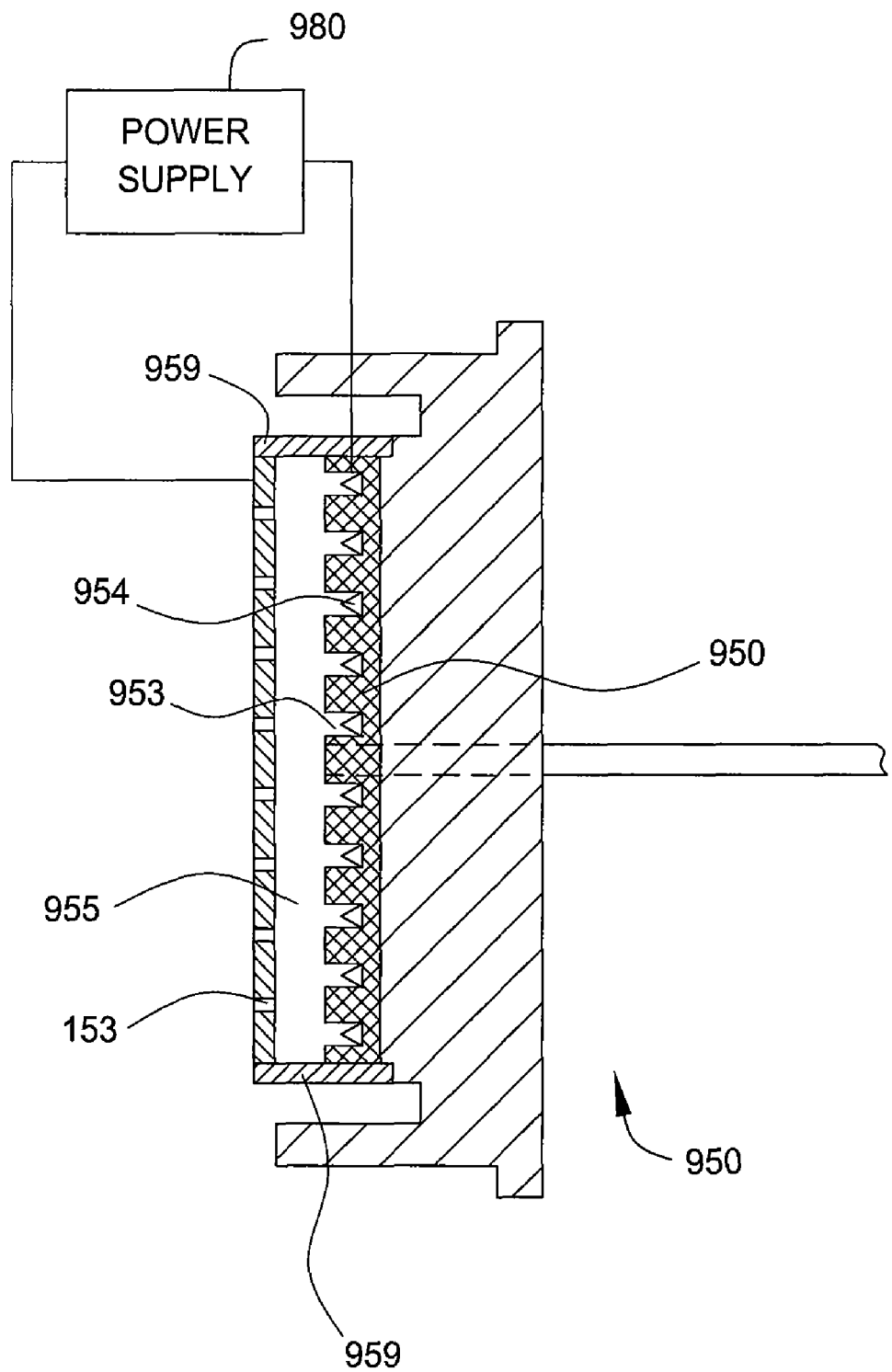
FIG. 9 illustrates a sectional side view of another embodiment of an injector assembly for a batch processing chamber of the invention including an assembly for exciting species of the processing gases within an injector assembly.

FIG. 9 shows another embodiment of an injector assembly. As compared to the embodiment shown in FIG. 8, a separate conductive element 950 is provided at the rear end of the vertical channel as the cathode. The cathode 950 is provided with a plurality of small cavities. These cavities are in the form of cylinders with a small diameter in the range of 1 mm to 12 mm, are provided as an array of additional hollow cathodes. Thereby, the hollow cathode effect providing the UV light with a wavelength corresponding to the gas in the vertical channel and/or the cathode material can be multiplied. As a result, the photon density in the vertical channel and in the process region wherein the substrates are processed can be increased. Alignment between hollow cathodes and the faceplate holes ensures that transmission into the process region is optimized.

Tips 954 may be provided in the hollow cathodes. The tips may be used to increase the electrical field strength due to the small curvature of the tip and improve striking of a glow discharged at lower voltage levels.

According to another embodiment (not shown) a glow discharge may also be generated between the diffuser and the face of the injector, that is one side of the faceplate. Thereby, the diffuser is provided as the anode and the face of the injector is the cathode.

For all embodiments where the glow discharge is contained in a plenum of the injector for UV production, differential pumping may used (not shown). In some instances, the process pressure at the substrates may be lower than the pressure required by the glow discharge used for UV production. In this case, gas used for glow discharge may be diverted from the process chamber.

For all embodiments where the glow discharge is contained in a plenum of the injector for UV production, an UV transparent membrane may be fastened to the reactor side of the injector faceplate (not shown.) In some instances, the process pressure at the substrates may be higher than the pressure required by the glow discharge used for UV production. In this case, gas from the process is isolated from the gas used for glow discharge by a barrier. Since the barrier is UV transparent, UV is transmitted to the substrates. The barrier is thin to optimize UV transmission, but thick enough to support a process pressure of up to about 10 Torr.

Generally, for the UV assisted batch processing chambers, the wavelength of the UV radition, that is the photon energy, may be selected based on the gases used in the hollow cathode. Typical noble gases and their irradiated photon energy based on recombination of the excited states are He (for example, 21.22 eV, 40.82 eV, 40.38 eV), Ne (for example, 16.85 eV, 16.67 eV, 26.9 eV) or Ar (for example, 11.83 eV, 11.63 eV, 13.48 eV, 13.30 eV). Broad spectrum UV from deuterium lamps, or other UV sources (for example a mercury lamp), as well as softer UV radiation is also applicable.

Further, for UV assisted batch processing chambers, a susceptor for carrying the substrates formed of silicon carbide (SiC) may be adapted to reflect the UV light. The susceptor profile and the roughness may be adapted to reflectively focus the UV light on the substrate surfaces. Thereby, a location of excitation of processing gas species by UV radiation may be even closer to the substrate surfaces. The cylindrical geometry of the inner chamber 101 favors glancing angles for which UV reflectivity is enhanced relative to normal incidence. With a glow discharge in the injector vertical channel, UV assisting may be provided during any process step having appropriate conditions for the glow discharge. As mentioned above, conditions in the plenum of the injector and the processing region may vary if a gas diversion, a barrier or other measures are provided. Thereby, conditions appropriate for glow discharge may be provided in the parts of the chamber. Appropriate process conditions may include the injection of a gas desired for the glow discharge. For 11.63 eV and 11.83 eV photons from Ar, an optimal pressure of the glow discharge is 0.45 Torr, and the reflectivity for SiC is 0.4 at normal incidence and at $\pi/4$ incidence.

For CVD processes that require UV assistance, the expected duty cycle is continuous. For ALD processes, there are several instances for which UV assistance may be required for film properties and/or for throughput. UV assistance may be required for one or all precursor exposures where the photon energy may be required to start the reaction between precursor molecule and surface binding site. UV assistance may be required during the cycle-purging steps at the end of an ALD cycle to complete the surface reaction such that incorporation of reaction byproducts is minimized.

In the following, further embodiments will be described while making reference to FIGS. 8 and 9. As described above, UV assisted processes can be provided with a vertically extending anode and a vertically extending hollow cathode, wherein the anode and the cathode is arranged such that the anode is closer to the substrate boat holding the wafer stack.

The embodiments described above with respect to the plasma assisted processes and the hollow cathode effect may also be utilized for ion assisted ALD or CVD batch processing chambers. Therefore, according to one embodiment, a diffuser would be the cathode and the injector face would be the anode. According to another embodiment, the injector face side of the vertical channel (faceplate side of the vertical channel) would be the cathode and the opposing side of the injector located towards the body of the injector assembly would be the anode. Generally, the power supply is connected to the respective components of the previous embodiments with a polarization, such that ions are provided to the processing region. In light of the ionization of species of processing gases, ion generating assistance during batch processing may also be considered one form of process assisted by excited species. Further, the diffuser may be modified to provide a hollow cathode effect.

Ions generated in the glow discharge are then accelerated towards the process region. Ions and neutrals may pass the cathode through openings provided therein. Thus, the ions and neutrals enter the process region and can assisted processes by the energy or the momentum of the ions. The kinetic energy of the ions and neutrals may be about 600 eV. Optionally retarding grids may be used to reduce the ion energy. A retarding grid may be provided in form of a mesh with a potential applied thereto. The potential decelerates the ions. The decelerated ions may pass through openings in the grid. A charged grid mounted between the injector and the wafer boat can, thus, reduce the energy and the momentum to a desired level.

For the embodiments relating to plasma assisted processes, UV assisted processes or ion assisted processes, the electrode formed by the elements of the injector and the exhaust may be grounded, whereas the other electrode is biased. Elements of the injector or exhaust assembly may be an anode or a cathode for plasma generation, UV generation or ion generation. Generally, it is to be understood that either one of the anode or the cathode may be grounded.

While the foregoing is directed to embodiments of the invention, other and further embodiments of the invention may be devised without departing from the basic scope thereof, and the scope thereof is determined by the claims that follow.

The invention claimed is:

1. A method for batch processing of substrates, comprising:
   processing a batch of substrates vertically stacked in a substrate boat within a chamber;
   using a cathode unit or an anode unit to diffuse a processing gas into the chamber; and
   exciting species of the processing gas within an excitation region of the chamber, wherein the excitation region extends along the vertical dimension of the batch of substrates stacked within the substrate boat, wherein exciting the species comprises causing a noble gas glow discharge with a hollow tube cathode provided within an injector assembly for the processing gas.

* * * * *

UNITED STATES PATENT AND TRADEMARK OFFICE
CERTIFICATE OF CORRECTION

PATENT NO. : 8,168,269 B2  
APPLICATION NO. : 12/883889  
DATED : May 1, 2012  
INVENTOR(S) : Mahajani et al.

Page 1 of 1

It is certified that error appears in the above-identified patent and that said Letters Patent is hereby corrected as shown below:

Title Page, Inventors (75):

Please delete "Mahreeyee" and insert -- Maitreyee -- therefor;

Please delete "Brendon" and insert -- Brendan -- therefor;

In the Detailed Description:

Column 14, Line 63, please delete "radition" and insert -- radiation -- therefor.

Signed and Sealed this
Twenty-eighth Day of August, 2012

David J. Kappos
*Director of the United States Patent and Trademark Office*